United States Patent [19]
Ueyanagi et al.

[11] Patent Number: 4,683,487
[45] Date of Patent: Jul. 28, 1987

[54] HETEROJUNCTION BIPOLAR TRANSISTOR

[75] Inventors: Kiichi Ueyanagi, Kokubunji; Susumu Takahashi, Nishitama; Toshiyuki Usagawa, Kokubunji; Yasunari Umemoto, Hachioji; Toshihisa Tsukada, Musashino, all of Japan

[73] Assignee: Hitachi, Ltd., Tokyo, Japan

[21] Appl. No.: 795,465

[22] Filed: Nov. 6, 1985

[30] Foreign Application Priority Data

Nov. 9, 1984 [JP] Japan .................................. 59-234908

[51] Int. Cl.$^4$ ........................................... H01L 29/72
[52] U.S. Cl. ...................................... 357/34; 357/16; 357/49; 357/52; 357/91
[58] Field of Search .................... 357/34, 52, 49, 16, 357/91

[56] References Cited

U.S. PATENT DOCUMENTS

| | | | |
|---|---|---|---|
| 4,480,319 | 10/1984 | Hotta et al. | 357/51 |
| 4,566,020 | 1/1986 | Shannon | 357/34 |
| 4,571,817 | 2/1986 | Birritella et al. | 357/34 |

*Primary Examiner*—Edward J. Wojciechowicz
*Attorney, Agent, or Firm*—Antonelli, Terry & Wands

[57] ABSTRACT

A collector lead-out portion and a base lead-out portion are formed so as to oppose to each other in such a manner that active regions including a collector, a base and an emitter are sandwiched therebetween. The collector lead-out portion and the base lead-out portion are formed by ion implantation or selective epitaxial growth. Thus, a planar type heterojunction bipolar transistor capable of a high density of integration is formed.

19 Claims, 30 Drawing Figures

HETEROJUNCTION BIPOLAR TRANSISTOR

BACKGROUND OF THE INVENTION

The present invention relates to a heterojunction bipolar transistor for processing high-speed signals, and more particularly to a device structure well suited to raise the integration density and enhance the performance of the transistor and a method of producing the same.

The heterojunction bipolar transistor is characterized in that a base-emitter junction is formed using semiconductors with which the band gap of an emitter becomes wider than that of a base, thereby to reduce the injection of minority carriers from the base into the emitter. Thus, the efficiency of the injection of majority carriers from the emitter into the base is enhanced, and the impurity concentration of the base can be raised, so that a transistor of high current gain and low base resistance becomes possible.

The idea of the heterojunction bipolar transistor is old, and has been realized using a heterojunction of $Ga_{x-1}Al_xAs$-GaAs (Proceedings of the 12th conf on Solid State Devices, 1980, p. 1).

Figure 1:
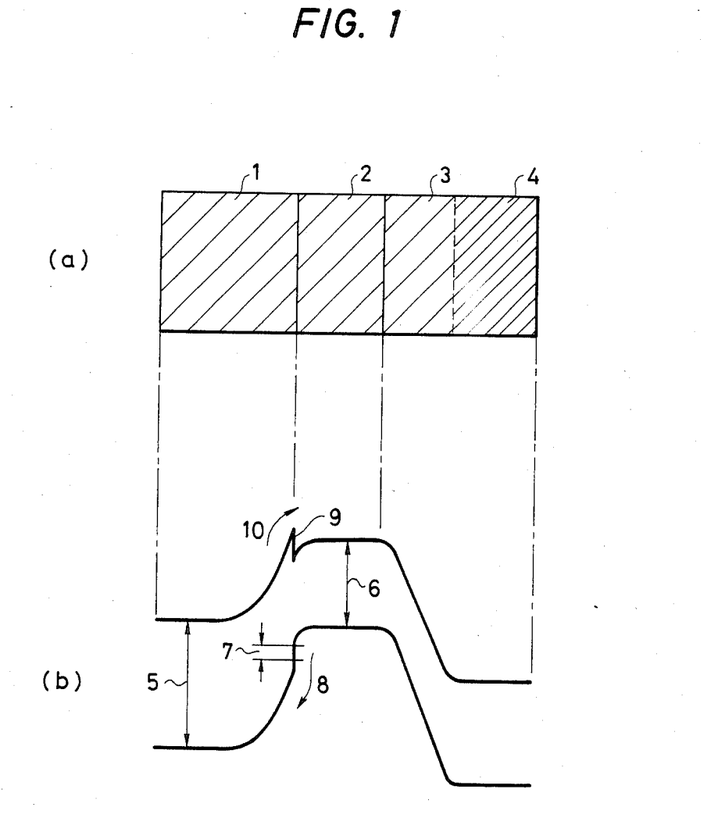

FIGS. 1(a) and 1(b) show the sectional structure and energy band structure of the active regions of the transistor, respectively. This transistor is constructed of an emitter 1 made of an n-type $Ga_{0.7}Al_{0.3}As$ layer, a base 2 made of a p-type GaAs layer, and a collector made of an n-type GaAs layer 3 and an n+-type GaAs layer 4. The band gap (5) of $Ga_{0.7}Al_{0.3}As$ is 1.79 eV, which is approximately 0.37 eV wider than the band gap (6) of GaAs. Approximately 0.05 eV of the difference is allotted to a valence band and lowers the energy level of the emitter by this component (7), to suppress the injection (8) of holes.

At a hetero-interface on a conduction band side, a notch (9) of about 0.3 eV arises in the band gap and similarly reduces the injection (10) of electrons. As an expedient for eliminating the notch (9), it has been considered to gently change the mixed ratio in the vicinity of the hetero-interface (for example, Solid State Electron., Vol. 15, No. 12, p. 1339, ('72)).

In addition, a structure in which the base 2 is also formed of $Ga_{1-x}Al_xAs$ having a mixed ratio gradient has been considered as an expedient wherein electrons in the base 2 are caused to reach the collector region 3 by drift, not by diffusion, thereby to achieve an enhanced operating speed (Japanese Patent Application Laid-open No. 49-43583).

However, both of the known examples mentioned above concern the active regions of the transistor, and the way how a base electrode and a collector electrode are led out becomes important for enhancing the performance.

Figure 2:
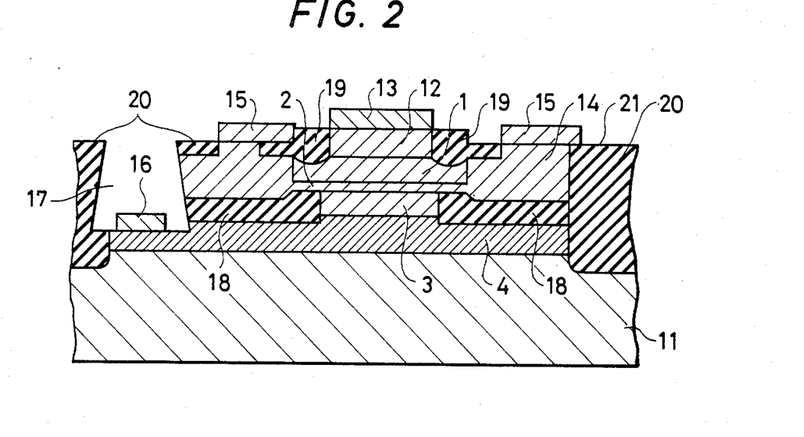
FIG. 2 is a sectional view showing a prior-art heterojunction bipolar transistor.

As an example whose portions for leading out the electrodes are most advanced, a transistor of a sectional structure shown in FIG. 2 has been developed ('84 ISSCC, Digest of Tech. Papers, p. 51 ('84)).

In this transistor, an n+-type GaAs layer 12 is disposed on active layers in order to improve the property of the ohmic contact between an emitter electrode 13 and the emitter 1. Portions accessory to the active regions are principally formed of base lead-out portions 14 as well as base electrodes 15 and a collector electrode 16. The base lead-out portions 14 are made of p-type layers which are formed on both the sides of the active layers by ion implantation. The collector electrode 16 is formed directly on the exposed collector layer 4 after the stacked layers have been windowed down to the collector layer 4 by selective etching as indicated by numeral 17.

Numerals 18, 19 and 20 designate insulating layers which are all formed by ion implantation. The layers 18 isolate the collector and the base, the layers 19 isolate the emitter and the base, and the layers 20 isolate the individual elements (numeral 11 indicates a substrate).

In the heterojunction bipolar transistor of this structure, the collector electrode 16 is formed at a position about 0.3 µm lower than the surface 21 of the device, to basically construct a mesa type structure, so that a high density of integration is difficult. Moreover, since the base lead-out portions are formed around the active regions, there are the problems that the area of the device enlarges and that the distance between the active regions and the collector electrode 16 lengthens to increase the series resistance.

SUMMARY OF THE INVENTION

An object of the present invention is to provide a heterojunction bipolar transistor which can be integrated at a high density.

Another object of the present invention is to provide a planar type heterojunction bipolar transistor.

Another object of the present invention is to provide a heterojunction bipolar transistor of high performance owing to a reduced parasitic capacitance.

The heterojunction bipolar transistor of the present invention is summarized as follows.

Active regions having a collector, a base and an emitter are formed by epitaxial growth.

Both a base region lead-out portion and a collector region lead-out portion are formed at the side parts of the active regions through insulating regions.

Since, in this manner, the lead-out portion for the base region or the collector region is formed on only one side of the active regions, the surface area of the element can be made small, and the integration of the elements at a high density is permitted.

Further, the surface portion of a semiconductor body which is a parent material constructing the heterojunction bipolar transistor is rendered substantially flat, and an emitter electrode, a base electrode and a collector electrode are formed on the flat portion.

In forming the base electrode and the collector electrode on the flat portion of the semiconductor body, the base region lead-out portion and the collector region lead-out portion are formed by ion implantation or selective epitaxial growth.

The base electrode and the collector electrode are formed on the surfaces of the base region lead-out portion and the collector region lead-out portion thus formed, whereby the fabrication of the planar element becomes possible. In addition, when the base lead-out portion and the collector lead-out portion are arranged in opposition and are formed so as to flatten the surface of the element, they can be self-aligned to the emitter. In this case, the area can be decreased, and uniformity in the sectional structures of the elements, in turn, uniformity in the characteristics of the elements can be achieved.

Further, the active regions are isolated from the collector and base lead-out regions by damaged layers which are formed by impurity ion implantation.

Thus, the reduction of parasitic capacitances becomes possible, and a heterojunction bipolar transistor of high performance is obtained.

It is to be understood that the heterojunction bipolar transistor of the present invention is applicable to both the n-p-n type and the p-n-p type. Further, it is possible to invert the role of the emitter and collector of the heterojunction bipolar transistor of the present invention as they are formed symmetrically on both sides of the base. In this case, an emitter lead-out portion and a base lead-out portion are formed so as to sandwich the collector region therebetween.

BRIEF DESCRIPTION OF THE DRAWINGS

FIG. 1(a) is a diagram for explaining the active regions of a heterojunction bipolar transistor, while FIG. 1(b) is a diagram showing the energy band structure thereof.

DETAILED DESCRIPTION OF THE INVENTION

Embodiments of the present invention will be described with reference to FIG. 3(a)–FIG. 7(f). While the embodiments exemplify bipolar transistors employing heterojunctions of $Ga_{x-1}Al_xAs$-GaAs, the invention is not restricted to the cases of the heterojunctions to be concretely mentioned below. It is needless to say that the invention is applicable to, for example, InGaAs-AlInAs, InGaAs-InGaAsP and Si-SiGe.

Of course, in constructing the bipolar transistors, the respective combination of semiconductors shall be of semiconductors which can form p-n junctions and whose lattice constants are close.

EMBODIMENT 1

The first embodiment of the present invention will be described with reference to FIGS. 3(a) thru 3(g).

In fabricating elements, on a GaAs substrate 11, there are epitaxially grown in succession an n+-GaAs layer (concentration: $1 \times 10^{18}$ cm$^{-3}$, thickness: 300 nm) 4 and an n−-GaAs layer (concentration: $5 \times 10^{16}$ cm$^{-3}$, thickness: 200 nm) 3 which constitute a collector layer, a p+-GaAs layer (concentration: $2 \times 10^{18}$ cm$^{-3}$, thickness: 50 nm) 2 which is a base layer, an n-$Ga_{1-x}Al_xAs$ layer (concentration: $1.5 \times 10^{17}$ cm$^{-3}$, thickness: 200 nm, mixed ratio x: approximately 0.2–0.4) 1 which is an emitter layer, and an n-GaAs layer (concentration: $2 \times 10^{17}$ cm$^{-3}$, thickness: 100 nm) 12 which is a protective film for the n-$Ga_{1-x}Al_xAs$ layer 1. The n-GaAs layer 12 prevents the oxidation of the n-$GA_{1-x}Al_xAs$ layer 1 and facilitates to establish an ohmic contact. Although the growth has been performed by the molecular beam epitaxy (MBE) of good film thickness controllability, it may well be performed by the MO-CVD (OMVPE: organo-metal vapor phase epitaxy). Further, the surface of the grown structure is covered with a CVD-SiO$_2$ film (thickness: 200 nm) 24 (FIG. 3(a)).

The resulting structure is subsequently coated with a photoresist film 25 (thickness: approximately 1 μm), whereupon the pattern of each collector lead-out portion is formed using the ordinary photolithographic process. After the SiO$_2$ film 24 has been windowed at each predetermined part 26 by utilizing the photoresist film 25, the collector lead-out portion 22 of the n+-type is formed by ion implantation 27 and annealing (FIG. 3(b)). This ion implantation is carried out so that the peak depth of implanted ions may substantially agree with the depth (∼300 nm) of the base layer 2, thereby to invert the base layer into the n-type. In case of using Si+ as an n-type impurity, the implantation energy is set at about 250 keV, and the dosage at $5 \times 10^{13}$ cm$^{-2}$. S, Se, Sn or the like may well be used instead of Si+. In this case, the implantation energy needs to be increased in proportion to the mass of the corresponding ion species. Thereafter, the resulting substrate is subjected to annealing for activating the implanted ions. The annealing is recommended to be performed at 800° C. for 15 minutes (in AsH$_3$ atmosphere), but annealing for a short time, for example, flash lamp annealing may well be adopted.

Figure 3A:
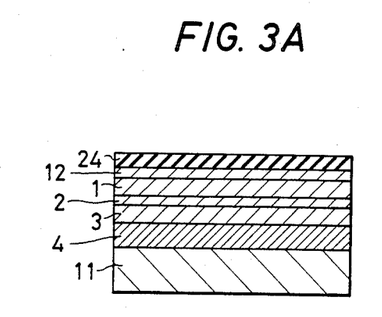
FIGS. 3(a) thru 3(g) are sectional views of an element showing the manufacturing steps of the heterojunction bipolar transistor which is a first embodiment of the present invention.
Figure 3B:
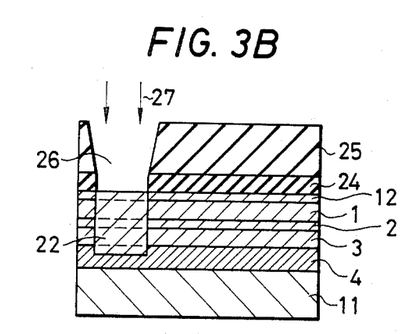
Figure 3C:
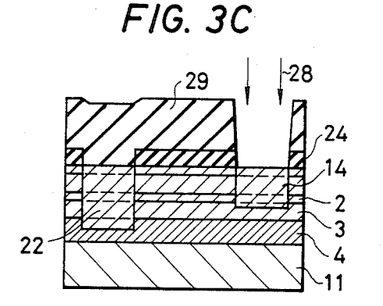

Next, similarly to the above process for forming the collector lead-out portion 22, p-type ion implantation 28 for forming each base lead-out portion 14 is carried out (FIG. 3(c)). Shown at numeral 29 is a photoresist mask for the ion implantation. Mg+ or Be+ is employed as ions to be implanted. The quantity of p-type carriers should desirably correspond to a concentration of at least $1 \times 10^{18}$ cm$^{-3}$ at the lower surface of the base layer. It is desirable to set the dosage at $2 \times 10^{13}$ cm$^{-2}$ and the implantation energy at approximately 100 keV for Mg+ and approximately 30 keV for Be+.

Figure 3D:
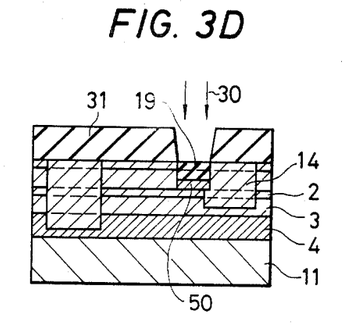
Figure 3E:
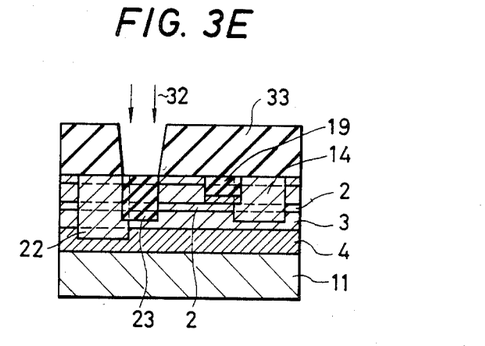
Figure 3F:
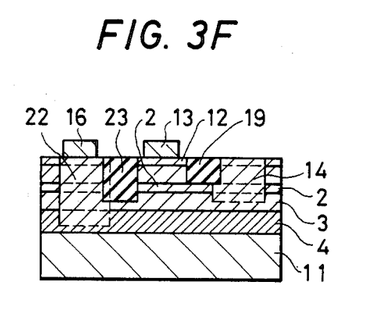
Figure 3G:
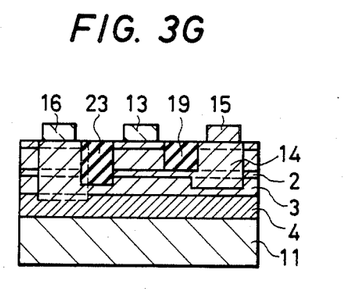

Next, ion implantation 30 for the isolation between the emitter 1 and the base lead-out portion 14 is carried out (FIG. 3(d)). The purpose of this ion implantation is to reduce a parasitic capacitance by forming a damaged layer 19.

Accordingly, the depth of the implantation may be such that damages reach a depletion layer 50 on the emitter side. The thickness of this depletion layer is several hundred Å in case of the aforementioned emitter concentration, so that the depth of the damaged layer may be approximately 2500 Å. The ion species may be any as long as the coefficient of diffusion in the crystal is small, and it may be one often used ordinarily, such as C+, O+, Ar+ or Si+. This ion implantation is performed so as to surround the active regions as shown in a plan view of FIG. 6(b) to be referred to later. When using C+, the optimum values of the dosage and the implantation energy are $1 \times 10^{13}$ cm$^{-2}$ and approximately 100 keV respectively. Shown at numeral 31 is a photoresist film for a mask.

Subsequently, ion implantation for the isolation between the active regions and the collector lead-out portion 22 is carried out. This ion implantation 32 is similar to the ion implantation in the case of the isolation of the base lead-out portion 14, and the same species of ions can be used. The depth needs to reach the lower side of the base layer 2, and in case of using $C^+$, the ion implantation is performed under conditions of 200 keV and $1 \times 10^{13}$ cm$^{-2}$. Numeral 33 designates a mask of a photoresist film (FIG. 3(e)).

Lastly, electrodes are formed on the surface of the element by the lift-off technique. First, an emitter electrode 13 and a collector electrode 16 are respectively formed on the n-type GaAs layers of the emitter portion 12, 2 and the collector lead-out portion 22 (FIG. 3(f)). A multilayer metal of Au/Ni/AuGe is used as an electrode material, and after patterning it by the use of the lift-off technique, ohmic contacts are formed by a heat treatment at 450° C. for 5 minutes. Subsequently, a base electrode 15 is formed on the base lead-out portion 14 by a similar process (FIG. 3(g)). In/Ag (Ag: 75%) is used as an electrode material. The conditions of a heat treatment for forming an ohmic contact are 450° C. and 5 minutes as in the case of the n-type layers.

As thus far described, according to the present embodiment, the planar type heterojunction bipolar transistor can be formed, so that a high density of integration becomes possible, and the active regions are electrically isolated from the base lead-out portion as well as the collector lead-out portion, so that the element which can operate at high speed owing to a low parasitic capacitance can be formed.

EMBODIMENT 2

Figure 4A:
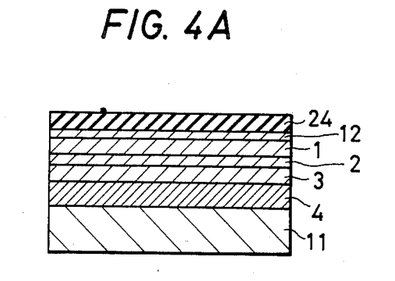
FIGS. 4(a) thru 4(c) are sectional views of an element showing some of the manufacturing steps of the heterojunction bipolar transistor which is a second embodiment of the present invention.
Figure 4B:
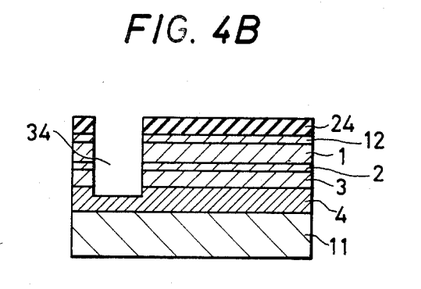
Figure 4C:
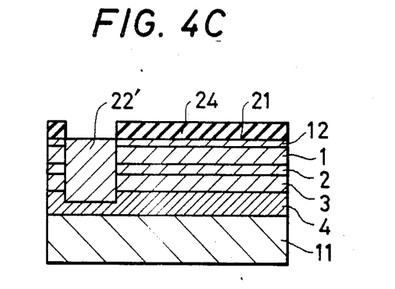

FIGS. 4(a) thru 4(c) show the major portions of a process for fabricating the second embodiment of the present invention. Since the present embodiment is quite the same as the first embodiment except for the formation of a collector lead-out portion, only the different portion will be described in detail.

As in the first embodiment, respective layers 4, 3, 2, 1, 12 and 24 are formed on a semiconductor substrate 11 (FIG. 4(a)).

Next, the pattern of a collector lead-out portion is formed using the ordinary photolithographic process, whereupon the corresponding part is removed by etching so as to form an opening 34 which extends down to the collector layer 4, 3 shown in FIG. 4(b). The etching of the SiO$_2$ film 24 in this case is executed by reactive ion etching with CF$_4$+H$_2$ gas, while the etching of the semiconductor layers is executed by reactive ion etching with CCl$_2$F$_2$ gas. Of course, each etching operation can also be executed by wet etching though the pattern controllability lowers.

Thereafter, n$^+$-GaAs is selectively grown in the part of the opening to the same level as the surface 21 of the element by the MO (organo-metal)-CVD, thereby to form the collector lead-out portion 22'. With the MO-CVD, GaAs is not grown on the SiO$_2$ film 24, so that only the collector lead-out portion 22' can be grown.

After the formation of the collector lead-out portion 22', the heterojunction bipolar transistor is formed by quite the same process as in the first embodiment, namely, the steps after FIG. 3(c).

As described above, according to the present invention, the collector lead-out portion 22' is formed by the epitaxial growth, so that it can be formed of only n$^+$-GaAs to permit the lowering of the resistance of this portion.

EMBODIMENT 3

The third embodiment of the present invention will be described with reference to FIGS. 5(a) thru 5(i). The present embodiment reduces a transistor area in such a way that the base lead-out portion 14, collector lead-out portion 22 and damaged layers 19, 23 of the heterojunction bipolar transistor of the first embodiment are formed in self-alignment to an emitter electrode.

Figure 5A:
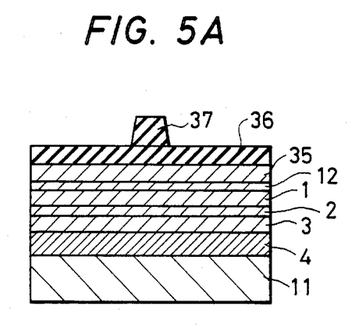
FIGS. 5(a) thru 5(i) are sectional views of an element showing the manufacturing steps of the heterojunction bipolar transistor which is a third embodiment of the present invention.
Figure 5B:
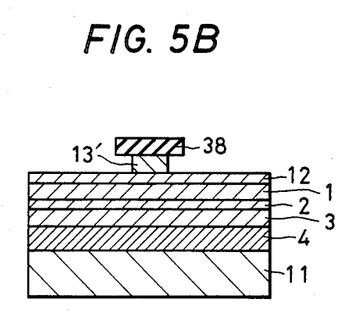

Accordingly, all of a semiconductor substrate 11 and epitaxially grown layers 1, 2, 3, 4 and 12 may be similar to those of the first embodiment (FIG. 5(a)).

The present embodiment will therefore be described in detail as to only points not included in the first embodiment. To the end of forming the base and collector lead-out portions 14, 19 in self-alignment to the emitter electrode, annealing for activation (800° C.) after ion implantation is needed, and refractoriness is required also of the emitter electrode. MoGe or WGe is used as a refractory ohmic electrode material 35 therefor. The electrode material is deposited on the surface of the epitaxial layer 12 to a thickness of 2000–3000 Å by sputtering or evaporation. Numeral 35 designates the deposited layer. In order to lower the resistance, Au/W, Al/W or Au/Pt/W may well be further deposited on the upper surface. By the way, in case of a p-n-p type heterojunction bipolar transistor, MoZn, MoMg or the like is employed as the refractory ohmic electrode material.

Subsequently, a CVD-SiO$_2$ film 36 is deposited on the whole surface to a thickness of 3000 Å. Using a photoresist film 37 in an emitter electrode pattern as a mask, the SiO$_2$ film 36 and the electrode film 35 are successively etched to form a T-shaped pattern at 38 and 13' by the two films (FIG. 5(b)). The etching of the SiO$_2$ film 36 is executed by reactive ion etching with CF$_4$+H$_2$ gas. The electrode film 35 is worked by first etching it anisotropically by the use of reactive ion etching with NF$_3$ gas and thereafter etching it laterally by the use of isotropic plasma etching. Thus, the T-shaped pattern is formed.

Figure 5C:
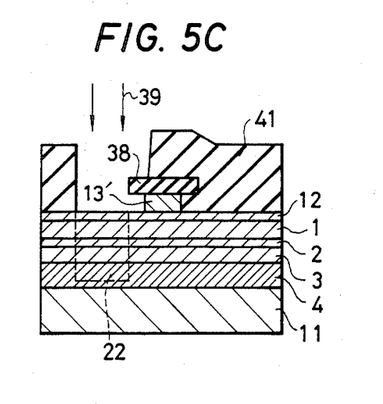
Figure 5D:
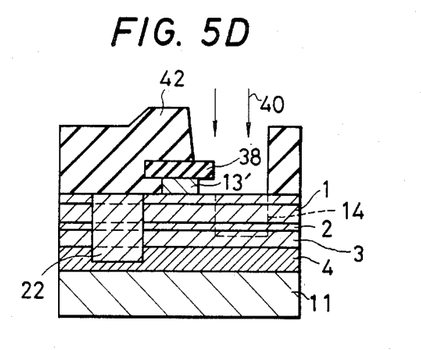

Next, using the SiO$_2$ film 38 of the T-shaped pattern as a mask, ion implantation operations 39 and 40 for forming the collector lead-out portion 22 and the base lead-out portion 14 respectively are carried out (FIGS. 5(c) and 5(d)). Numerals 41 and 42 designate photoresist films for masking the outer parts of the collector and emitter regions, respectively. Ions to be implanted and annealing therefor are similar to those in the first embodiment.

Figure 5E:
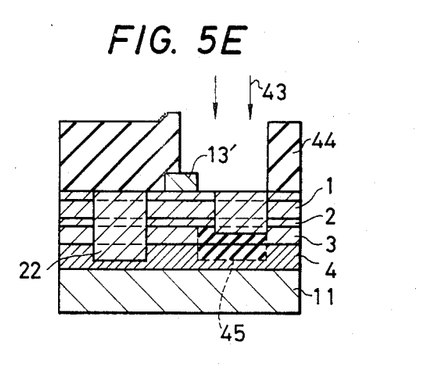

The SiO$_2$ film 38 is subsequently removed, whereupon ion implantation 43 for the electrical isolation between the collector portion 3, 4 and the base 2 is performed using the emitter electrode 13' as a mask (FIG. 5(e)). O$^+$ is used as ions. Numeral 44 designates a mask of photoresist. The conditions of the ion implantation are set at 200 keV and $2 \times 10^{12}$ cm$^{-2}$ so as to bring the position of a peak concentration into the collector layer 3. After the ion implantation, a heat treatment at 700° C. for 20 minutes for annealing damaged layers is carried out, while at the same time a layer 45 having deep traps owing to O$^+$ is formed.

Figure 5F:
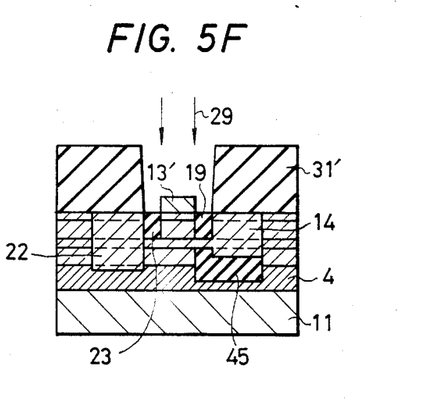
Figure 5G:
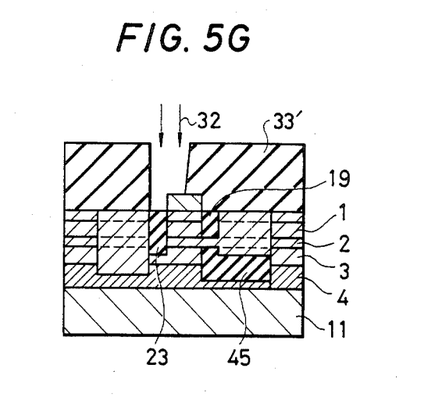

Next, as in the first embodiment, ion implantation operations 29 and 32 are performed for isolating the active regions from the base lead-out portion 14 and the collector lead-out portion 22 (FIGS. 5(f) and 5(g)). In the present embodiment, the conditions of the ion implantation operations are the same as in the first embodiment except that the emitter electrode 13' and photoresist films 31', 33' are used as masks.

Figure 5H:
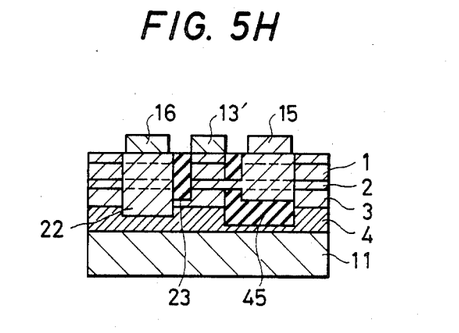
Figure 5I:
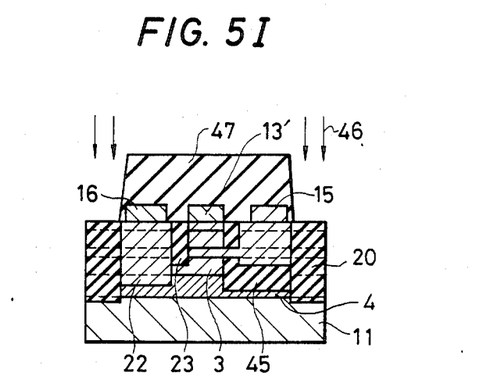

Next, a collector electrode 16 and a base electrode 15 are formed as in the first embodiment (FIG. 5(h)). Lastly, ion implantation 46 for isolating elements is carried out to finish up the elements. Ion species may be any capable of forming damages. For example, when the ions O+ are used, they are implanted by $1 \times 10^{13}$ cm$^{-2}$ at 150 keV and 250 keV respectively. Shown at numeral 47 is a photoresist mask for covering the element portion.

Figure 6A:
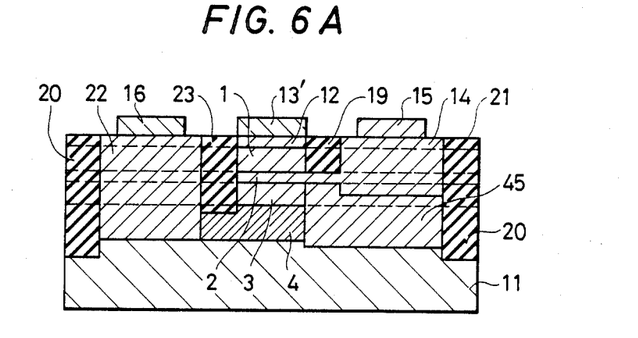
FIGS. 6(a) and 6(b) are a sectional view and a plan view of a heterojunction bipolar transistor which is a third embodiment of the present invention, respectively.
Figure 6B:
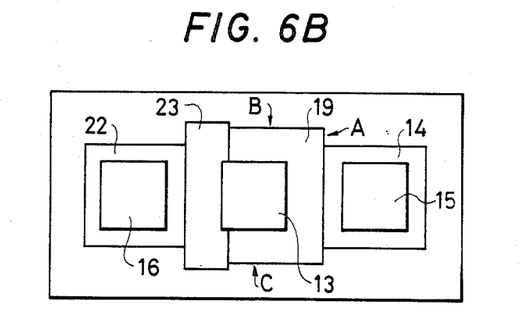

FIGS. 6(a) and 6(b) show a sectional view and a plan view of the heterojunction bipolar transistor of the present invention fabricated by the steps explained above, respectively. According to the present embodiment, the collector lead-out portion 22, the base lead-out portion 14 and the isolation regions 23, 19 between them and the active regions (1, 2, 3) are all formed in self-alignment to the emitter electrode 13', so that the area of the element is reduced to permit a raised density of integration, along with a high-speed operation. Moreover, since the respective regions can be formed at high positional accuracies, the dispersion among the elements can be diminished.

The self-alignment of the collector lead-out portion 22 as well as the base lead-out portion 14 in the present embodiment has been performed by the ion implantation employing the SiO$_2$ film 38 of the T-shaped pattern as the mask. However, this SiO$_2$ film 38 is not always necessary, but the ion implantation may well be performed using the emitter electrode 13' as a mask. Also in this case, the active regions and the lead-out portions 14, 22 can be isolated by the damaged layers 19 and 23.

While, in the present embodiment, the base lead-out portion 14 is disposed on the side A of the active regions as shown in FIG. 6(b), it may well be disposed on the side B or the side C or so as to surround the sides A, B and C. This applies also to the collector lead-out portion 22. In addition, these facts hold true for the other embodiments.

EMBODIMENT 4

The fourth embodiment of the present invention will be described with reference to FIGS. 7(a) thru 7(f). The present embodiment consists in that the collector-base insulation layer 45 in the third embodiment is formed before the epitaxial growth of the base layer 2, thereby to prevent the base lead-out portion 14 from being damaged into a high resistance by the ion implantation for forming the insulating layer 45. Accordingly, this embodiment differs from the third embodiment merely in the process for forming the insulating layer 45 and some processing steps and is quite the same as the third embodiment in points of the other individual processes. Only the features not included in the third embodiment will be described in detail.

A semiconductor substrate 11 and epitaxially grown layers 1, 2, 3, 4 and 12 to be used may be made of materials similar to those in the third embodiment, accordingly the first embodiment.

Figure 7A:
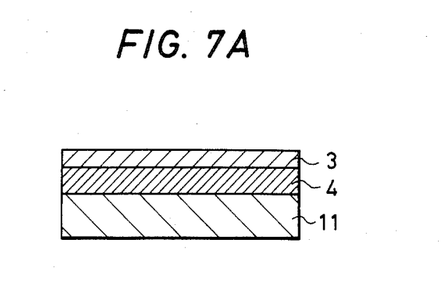
FIGS. 7(a) thru 7(f) are sectional views of an element showing the manufacturing steps of the heterojunction bipolar transistor which is a fourth embodiment of the present invention.
Figure 7B:
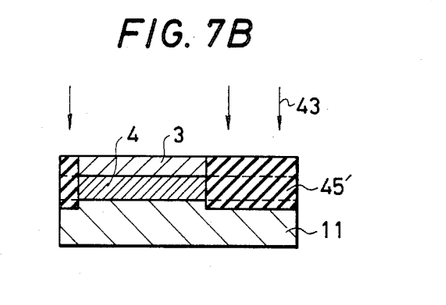

In the present embodiment, the collector layer 3, 4 is grown on the semiconductor substrate 11 as shown in FIG. 7(a), whereupon a collector-base insulation layer 45' is formed by ion implantation 43 (FIG. 7(b)). O+, Cr+ or the like capable of forming deep acceptors is used as an ion species. In case of O+, implantation conditions are 100 keV and $3 \times 10^{13}$ cm$^{-2}$. In case of forming the respective epitaxial layers by the use of the MBE (molecular beam epitaxy), the ion implantation 43 should desirably be continuously executed within an identical vacuum vessel. In that case, a selective ion implantation system which can scan a focused ion beam is employed.

Figure 7C:
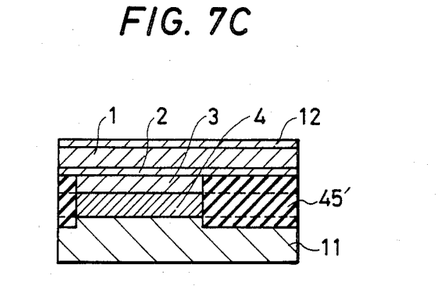

After the formation of the insulating layer, the base layer 2, the emitter layer 1 and an n+-GaAs layer 12 are epitaxially grown (FIG. 7(c)). The formation of the insulating layer 45' can also be executed using a photoresist film as a mask as in the third embodiment (FIG. 6(e)). In this case, the substrate is once taken out of the vacuum vessel, and the surface of the epitaxial layer is exposed to the atmosphere, so that the surface is contaminated. On this occasion, the growth is carried out after the epitaxial layer 3 has been etched by 200–300 Å with an etchant of an NH$_4$OH+H$_2$O$_2$ system to expose a clean surface.

Figure 7D:
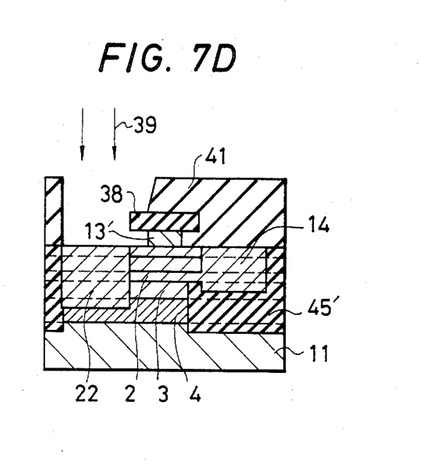
Figure 7E:
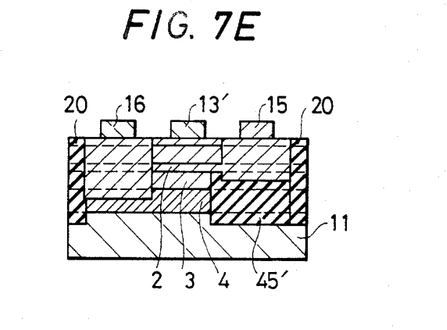
Figure 7F:
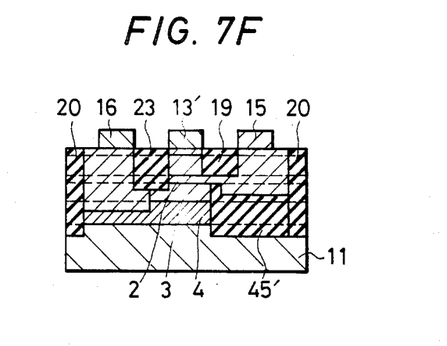

After forming the epitaxial layers 2, 1 and 12, the formation of the emitter electrode 13', collector lead-out portion 22 and base lead-out portion 14 (FIG. 7(d)), the formation of the collector electrode 16 and base electrode 15 (FIG. 7(e)), and the formation of the damaged layers 19, 23 and 20 for insulation are executed in quite the same way as in the third embodiment. Thus, the heterojunction bipolar transistor is fabricated.

Although, in the present embodiment, the collector lead-out portion 22 as well as the base lead-out portion 14 and the insulating layers 19, 23 have been self-aligned to the emitter electrode 13', the self-alignment is not always necessary, but they may well be formed by the individual photolithographic processes as in the first embodiment.

As thus far described, according to the present embodiment, the ion implantation for forming the base collector insulation layer 45' can be executed without the intervention of the base lead-out portion 14, so that the base and collector can be isolated without raising the resistance of the base lead-out portion 14. Therefore, both a parasitic resistance and a parasitic capacitance can be reduced, and the fabrication of a heterojunction bipolar transistor of high performance becomes possible.

What is claimed is:

1. A heterojunction bipolar transistor having a main surface and comprising active regions which include at least one heterojunction, the active regions having top and bottom surfaces extending in the same direction as the main surface and side surfaces extending between the top and bottom surfaces, a base region lead-out portion which is formed spaced from a side surface of said active regions and extending to said main surface, with an insulating region filling the space between the side surface of the active regions and the base region lead-out portion, and a collector region lead-out portion which is formed spaced from another side surface of said active regions and extending to said main surface, with another insulating region filling the space between said another side surface of the active regions and the collector region lead-out portion, wherein the insulating region and the another insulating region are regions in self-alignment with an emitter electrode on the main surface of the bipolar transistor.

2. A heterojunction bipolar transistor according to claim 1, wherein said collector region lead-out portion is formed in opposition to said base region lead-out portion with said active regions interposed therebetween.

3. A heterojunction bipolar transistor according to claim 1, wherein said main surface is substantially flat, and said emitter electrode, said base electrode and said collector electrode are formed on the flat surface.

4. A heterojunction bipolar transistor according to claim 3, wherein said collector lead-out portion is an impurity containing region which is formed by ion implantation.

5. A heterojunction bipolar transistor according to claim 4, wherein said collector lead-out portion is an impurity containing region which is formed by ion implantation, and the ion implantation is so performed that a peak of an impurity concentration reaches a depth corresponding substantially to the base region of said heterojunction bipolar transistor.

6. A heterojunction bipolar transistor according to claim 4, wherein said impurity containing region is of the n-conductivity type.

7. A heterojunction bipolar transistor according to claim 3, wherein said collector lead-out portion is constructed of a selectively grown semiconductor layer.

8. A heterojunction bipolar transistor according to claim 3, wherein said active regions are isolated from said base lead-out portion and said collector lead-out portion by damaged regions which are formed by impurity ion implantation.

9. A heterojunction bipolar transistor according to claim 3, wherein said collector lead-out portion and said base lead-out portion are in self-alignment to said emitter electrode.

10. A heterojunction bipolar transistor according to claim 4, wherein said collector lead-out portion and said base lead-out portion are in self-alignment to said emitter electrode.

11. A heterojunction bipolar transistor according to claim 3, wherein an insulating region between said active regions and said base region lead-out portion is formed to reach a depth at which it reaches a depletion layer on an emitter side to be formed at an interface between the emitter region and the base region.

12. A heterojunction bipolar transistor according to claim 8, wherein the insulating region between said active regions and said base lead-out portion is formed to reach a depth at which it reaches a depletion layer on an emitter side to be formed at an interface between the emitter region and the base region.

13. A heterojunction bipolar transistor according to claim 1, wherein the bipolar transistor comprises a plurality of layers forming respectively an emitter region, a base region and a collector region, the emitter, base and collector regions constituting said active regions of said bipolar transistor; wherein the bipolar transistor further includes emitter, base and collector electrodes respectively electrically connected to said emitter, base and collector regions; and wherein the collector region lead-out portion electrically connects the collector region to the collector electrode and the base region lead-out portion electrically connects the base region to the base electrode.

14. A heterojunction bipolar transistor according to claim 13, wherein said collector region lead-out portion and said base region lead-out portion are portions in self-alignment with said emitter electrode.

15. A heterojunction bipolar transistor according to claim 1, wherein said collector region lead-out portion and said base region lead-out portion are portions in self-alignment with said emitter electrode.

16. A heterojunction bipolar transistor according to claim 15, wherein the collector region lead-out portion and the base region lead-out portion are portions, formed by ion implantation, in self-alignment with the emitter electrode, and wherein the insulating region and the another insulating region are damaged layers, formed by ion implantation and annealing, the ion implantation being formed in self-alignment with the emitter electrode.

17. A heterojunction bipolar transistor according to claim 16, wherein the emitter electrode is made of a refractory ohmic electrode material.

18. A heterojunction bipolar transistor according to claim 17, wherein the ion-implanted region for the isolation between said active regions and said collector lead-out portion is formed deeper than the base region.

19. A heterojunction bipolar transistor according to claim 1, wherein the insulating region and the another insulating region are damaged layers, formed by ion implantation and annealing, the ion implantation being performed in self-alignment with the emitter electrode.

* * * * *